United States Patent
Takeuchi

(10) Patent No.: US 8,134,199 B2
(45) Date of Patent: Mar. 13, 2012

(54) NONVOLATILE SEMICONDUCTOR MEMORY

(75) Inventor: Yuji Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/917,906

(22) Filed: Nov. 2, 2010

(65) Prior Publication Data

US 2011/0042737 A1 Feb. 24, 2011

Related U.S. Application Data

(60) Continuation of application No. 12/543,604, filed on Aug. 19, 2009, now Pat. No. 7,838,404, which is a division of application No. 11/565,822, filed on Dec. 1, 2006, now Pat. No. 7,595,522.

(30) Foreign Application Priority Data

Dec. 2, 2005 (JP) ................................ 2005-349045

(51) Int. Cl.
*H01L 29/788* (2006.01)

(52) U.S. Cl. ........ 257/316; 257/288; 257/296; 438/197; 438/259

(58) Field of Classification Search .................. 257/288, 257/296, 314, 315, 316; 438/197, 259, 296, 438/424, 435

See application file for complete search history.

(56) References Cited

U.S. PATENT DOCUMENTS

| | | | | |
|---|---|---|---|---|
| 5,675,159 A | * | 10/1997 | Oku et al. | 257/284 |
| 6,222,225 B1 | * | 4/2001 | Nakamura et al. | 257/315 |
| 6,228,717 B1 | * | 5/2001 | Hazama et al. | 438/265 |
| 6,342,715 B1 | | 1/2002 | Shimizu et al. | |
| 6,555,427 B1 | | 4/2003 | Shimizu et al. | |
| 6,620,681 B1 | * | 9/2003 | Kim et al. | 438/257 |
| 6,649,965 B2 | * | 11/2003 | Takada et al. | 257/314 |
| 7,192,831 B2 | * | 3/2007 | Aritome | 438/258 |
| 7,445,997 B2 | * | 11/2008 | Lee et al. | 438/260 |
| 7,504,304 B2 | | 3/2009 | Yaegashi et al. | |
| 7,692,235 B2 | | 4/2010 | Yaegashi | |
| 2002/0179960 A1 | * | 12/2002 | Kang et al. | 257/315 |
| 2005/0212034 A1 | | 9/2005 | Sasago et al. | |
| 2006/0214217 A1 | | 9/2006 | Watanabe et al. | |
| 2006/0237754 A1 | | 10/2006 | Ishida | |

(Continued)

FOREIGN PATENT DOCUMENTS

JP 10-256399 9/1998

(Continued)

OTHER PUBLICATIONS

Yong-Sik Yim, et al., "70nm NAND Flash Technology with 0.25μm$^2$ Cell Size for 4Gb Flash Memory", 4 pages, 2003.

(Continued)

*Primary Examiner* — Phuc Dang
(74) *Attorney, Agent, or Firm* — Oblon, Spivak, McClelland, Maier & Neustadt, L.L.P.

(57) ABSTRACT

A nonvolatile semiconductor memory fabrication method including forming a first insulating film and a floating gate electrode material on a semiconductor substrate; forming a gate insulating film and a floating gate electrode by etching the first insulating film and the floating gate electrode material, respectively, and forming a groove for an element isolation region by etching the semiconductor substrate; and forming an element region and the element isolation region by burying a second insulating film in the groove and planarizing the second insulating film.

15 Claims, 12 Drawing Sheets

U.S. PATENT DOCUMENTS

2007/0132007 A1 6/2007 Kamigaichi et al.

FOREIGN PATENT DOCUMENTS

| JP | 11-163304 | 6/1999 |
| --- | --- | --- |
| JP | 2001-118944 | 4/2001 |
| JP | 2003-289114 | 10/2003 |
| JP | 2004-22819 | 1/2004 |

OTHER PUBLICATIONS

Japanese Office Action issued Aug. 31, 2010, in Japanese Patent Application No. 2005-349045, filed Aug. 26, 2010 (with English-language Translation).

Office Action issued Dec. 21, 2010 in Japan Application No. 2005-349045 (With English Translation).

* cited by examiner

NONVOLATILE SEMICONDUCTOR MEMORY

CROSS REFERENCE TO RELATED APPLICATION

This application is a continuation application of U.S. application Ser. No. 12/543,604, filed Aug. 19, 2009, (now U.S. Pat. No. 7,838,409) which is a divisional application of U.S. application Ser. No. 11/565,822, filed Dec. 1, 2006, now U.S. Pat. No. 7,595,522 and claims benefit of priority under 35 USC §119 from the Japanese Patent Application No. 2005-349045, filed on Dec. 2, 2005. The entire contents of the above-identified applications are incorporated herein by reference.

BACKGROUND OF THE INVENTION

The present invention relates to a nonvolatile semiconductor memory and a method of fabricating the same and, more particularly, to the structure of a gate electrode in an electrically programmable device and a method of fabricating the same.

Some electrically programmable nonvolatile semiconductor memories have a stacked gate structure including a floating gate electrode, inter-gate insulating film, and control gate electrode, in which an element region is formed in self-alignment with the floating gate electrode, and the inter-gate insulating film is formed on the upper surface and on portions of the side surfaces of the floating gate electrode.

This type of device is conventionally fabricated by the following procedure.

First, a gate insulating film, a polysilicon film serving as a floating gate electrode, and a mask material are formed on a semiconductor substrate. The mask material is patterned by photolithography or the like. The obtained mask material is used as a mask to etch the floating gate electrode and gate insulating film in self-alignment with each other. In addition, the semiconductor substrate is etched to form a groove for an element isolation region.

Subsequently, an insulating film is buried in the element isolation region and planarized by CMP (Chemical Mechanical Polishing) or the like, and the mask material is removed.

The insulating film buried in the element isolation region is etched back to make the upper surface of the insulating film in the element isolation region lower than that of the floating gate electrode.

An inter-gate insulating film is formed, and a polysilicon layer serving as a control gate electrode and a tungsten silicide film are deposited.

The gate electrode is patterned by removing unnecessary portions of the control gate electrode, inter-gate insulating film, and floating gate electrode.

After that, a semiconductor device is completed by forming interlayer dielectric films, contacts, interconnection layers, and the like.

Unfortunately, the conventional nonvolatile memory and the method of fabricating the same have the following problem.

If generally used anisotropic etching is used to etch the inter-gate insulating film subsequently to patterning of the gate electrode, the inter-gate insulating film on the side surface of the floating gate electrode readily remains after the etching because the effective film thickness (vertical component) of the inter-gate insulating film on the side surface is large. If the inter-gate insulating film remains, the floating gate electrode material readily remains when the floating gate electrode is etched after that. If the floating gate electrode material remains, an electrical shortcircuit occurs between adjacent gates, and this causes an operation error of the device.

A reference disclosing the conventional nonvolatile semiconductor memory is as follows.

Yong-Sik Yim, Kwang-Shik Shin, "70 nm NAND Flash Technology with 0.025 µm$^2$ Cell Size for 4 Gb Flash Memory", Semiconductor R & D Center, Samsung Electronics Co., LTD.

SUMMARY OF THE INVENTION

According to one aspect of the invention, there is provided a nonvolatile semiconductor memory comprising: a floating gate electrode formed on a gate insulating film on an element region isolated by an element isolation region on a semiconductor substrate; an inter-gate insulating film formed to cover a portion from an upper surface to a middle of a side surface of said floating gate electrode; and a control gate electrode formed on said floating gate electrode via said inter-gate insulating film, wherein a portion from the upper surface of said floating gate electrode to at least a middle of the portion of the side surface which is covered with said inter-gate insulating film has a tapered shape largely inclined to a direction perpendicular to a surface of said semiconductor substrate, compared to the other portion of the side surface.

According to one aspect of the invention, there is provided a nonvolatile semiconductor memory comprising: a floating gate electrode formed on a gate insulating film on an element region isolated by an element isolation region on a semiconductor substrate; an inter-gate insulating film formed to cover a portion from an upper surface to a middle of a side surface of said floating gate electrode; and a control gate electrode formed on said floating gate electrode via said inter-gate insulating film, wherein a portion from the upper surface of said floating gate electrode to at least a middle of the portion of the side surface which is covered with said inter-gate insulating film has a shape which increases, toward the upper surface, an inclination angle to a direction perpendicular to a surface of said semiconductor substrate, unlike the other portion of the side surface.

According to one aspect of the invention, there is provided a nonvolatile semiconductor memory fabrication method comprising: forming a first insulating film and a floating gate electrode material on a semiconductor substrate; forming a gate insulating film and a floating gate electrode by etching the first insulating film and the floating gate electrode material, respectively, and forming a groove for an element isolation region by etching the semiconductor substrate; forming an element region and the element isolation region by burying a second insulating film in the groove and planarizing the second insulating film; removing a portion of an upper surface of the second insulating film in the element isolation region to expose an upper surface and a portion of a side surface of the floating gate electrode, and processing a portion from the exposed upper surface to the exposed side surface of the floating gate electrode such that the portion has one of a tapered shape having an inclination angle to a direction perpendicular to a surface of the semiconductor substrate, and an arcuate shape; forming an inter-gate insulating film on the exposed upper surface and the exposed side surface of the floating gate electrode; depositing a control gate electrode material on the inter-gate insulating film; and forming a stacked gate structure by etching the control gate electrode material, the control gate electrode, the inter-gate insulating film, and the floating gate electrode.

DETAILED DESCRIPTION OF THE INVENTION

Embodiments of the present invention will be explained below with reference to the accompanying drawings.

First Embodiment

Figure 1:
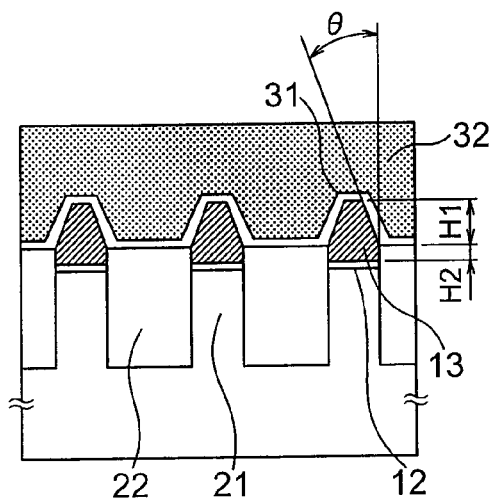
FIG. 1 is a sectional view showing the longitudinal sectional structure of a nonvolatile semiconductor memory according to the first embodiment of the present invention.
Figure 2:
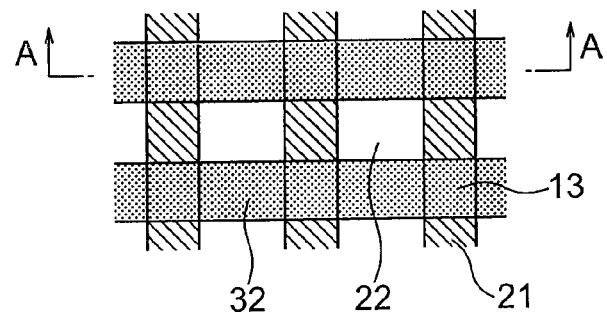
FIG. 2 is a plan view showing the planar structure of the nonvolatile semiconductor memory according to the first embodiment.

FIGS. 1 and 2 show a nonvolatile semiconductor memory according to the first embodiment of the present invention.

FIG. 1 is a sectional view, and FIG. 2 is a plan view. FIG. 1 shows a longitudinal section taken along a line A—A in FIG. 2.

This semiconductor device comprises, in the surface portion of a semiconductor substrate 11, element isolation regions 22, element regions 21 isolated from each other by the element isolation regions 22, a floating gate electrode 13 formed on the surface of each element region 21 via a gate insulating film 12, and a control gate electrode 32 formed on the surfaces of the element isolation regions 22 and on the surfaces of the floating gate electrodes 13 on the element regions 21 via an inter-gate insulating film 31.

This gate electrode has a stacked gate structure formed by stacking the floating gate electrode 13, inter-gate insulating film 31, and control gate electrode 32. The element region 21 is formed in self-alignment with the floating gate electrode 13. The inter-gate insulating film 31 is formed on the upper surface of the floating gate electrode 13 and from the upper surface to the middle of each side surface of the floating gate electrode 13.

Also, the floating gate electrode 13 has a tapered shape such that a portion having a height H1, where the inter-gate insulating film 31 is formed, from the upper surface to the middle of the side surface of the floating gate electrode 13 makes an inclination angle θ with the direction perpendicular to the surface of the semiconductor substrate 11. A portion having a height H2, where the inter-gate insulating film 31 is not formed, of the side surface of the floating gate electrode 13 is perpendicular to the surface of the semiconductor substrate 11.

A method of fabricating the nonvolatile semiconductor memory according to the first embodiment will be explained below with reference to FIGS. 3 to 10 showing sections in different steps. FIGS. 3 to 10 are sectional views of portions between adjacent gates.

Figure 3:
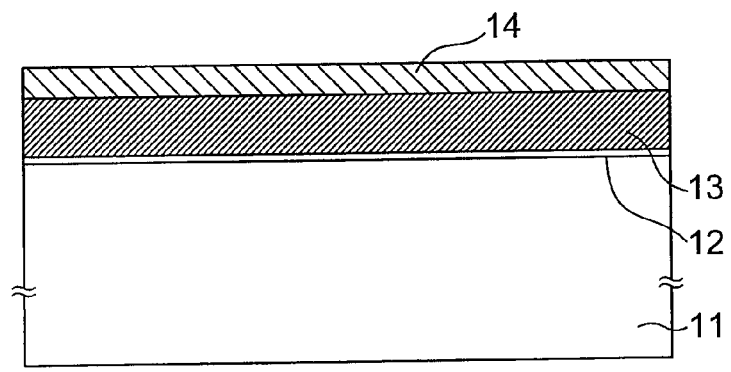
FIG. 3 is a sectional view showing a longitudinal sectional structure in a predetermined step of a method of fabricating the nonvolatile semiconductor memory according to the first embodiment.

First, as shown in FIG. 3, a gate insulating film 12, a polysilicon film 13 serving as a floating gate electrode, and a mask material 14 are sequentially formed on a semiconductor substrate 11. The mask material 14 is made of, e.g., a silicon nitride film.

Figure 4:
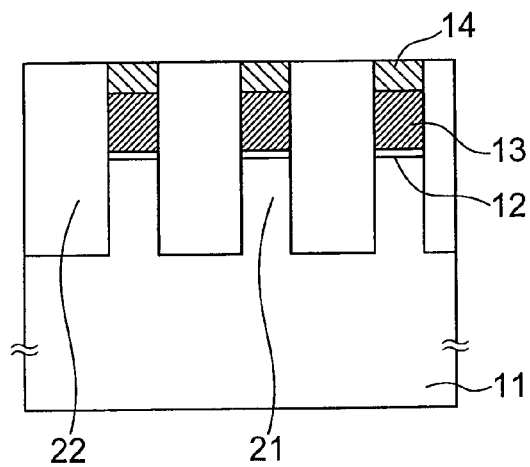
FIG. 4 is a sectional view showing a longitudinal sectional structure in a predetermined step of a method of fabricating the nonvolatile semiconductor memory according to the first embodiment.

As shown in FIG. 4, the mask material 14 is patterned into a desired shape by photolithography or the like. The floating gate electrode 13 and gate insulating film 12 are etched in self-alignment with the mask material 14, and the semiconductor substrate 11 is etched to form grooves for element isolation regions 22. Subsequently, an insulating film is buried in the element isolation regions 22 and planarized by, e.g., CMP.

Figure 5:
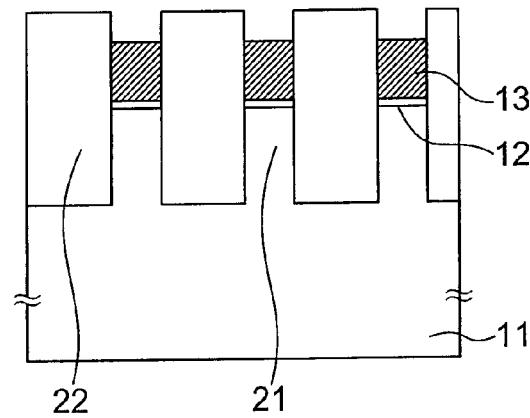
FIG. 5 is a sectional view showing a longitudinal sectional structure in a predetermined step of a method of fabricating the nonvolatile semiconductor memory according to the first embodiment.

After that, the mask material 14 is removed as shown in FIG. 5. When a silicon nitride film is used as the mask material 14, the mask material is removed using, e.g., hot phosphoric acid.

Figure 6:
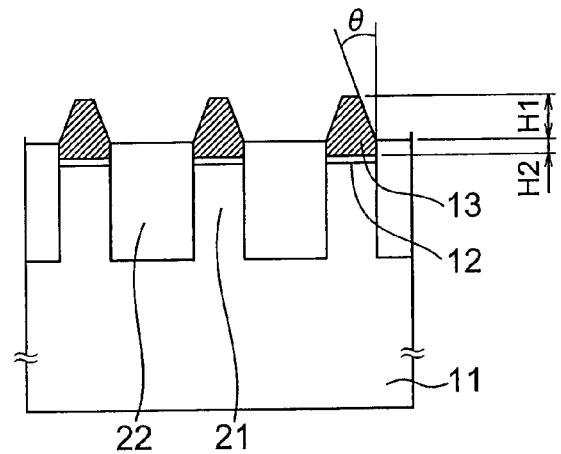
FIG. 6 is a sectional view showing a longitudinal sectional structure in a predetermined step of a method of fabricating the nonvolatile semiconductor memory according to the first embodiment.

As shown in FIG. 6, the insulating films buried in the element isolation regions 22 are etched back. This makes the upper surfaces of the element isolation regions 22 lower than those of the floating gate electrodes 13. In this stage, the side surfaces of the floating gate electrodes 13 are perpendicular to the surface of the semiconductor substrate 11. The floating gate electrodes 13 in this state are etched to incline their side surfaces.

This etching uses, e.g., conditions which isotropically etch polysilicon. Consequently, the upper end corners of each floating gate electrode 13 are etched away to form a tapered shape having an angle θ as shown in FIG. 6.

This etching for inclining the side surfaces of the floating gate electrodes 13 can be performed either after or simultaneously with etch back of the insulating films buried in the element isolation regions 22.

Etch back of the insulating films buried in the element isolation regions 22 is performed under the conditions that the selectivity of the insulating films to the polysilicon films is high, i.e., the insulating films are selectively etched while the polysilicon films are left behind. As a consequence, the floating gate electrodes 13 remain even after etch back. However, etch back may also be performed under the conditions that the selectivity is low, i.e., the polysilicon films are also more or less etched together with the insulating films.

Figure 7:
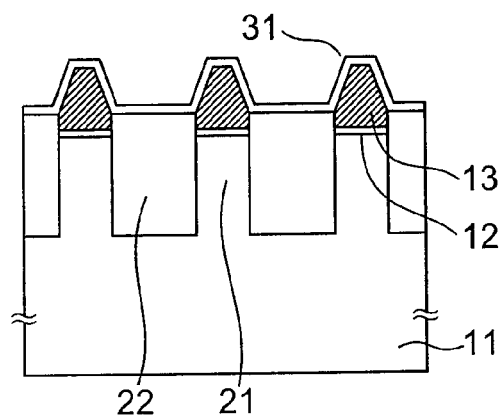
FIG. 7 is a sectional view showing a longitudinal sectional structure in a predetermined step of a method of fabricating the nonvolatile semiconductor memory according to the first embodiment.

Subsequently, an inter-gate insulating film 31 is formed on the surface as shown in FIG. 7.

Figure 8:
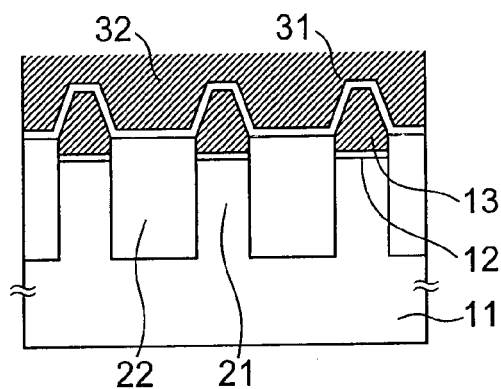
FIG. 8 is a sectional view showing a longitudinal sectional structure in a predetermined step of a method of fabricating the nonvolatile semiconductor memory according to the first embodiment.

In addition, as shown in FIG. 8, a polysilicon film serving as a control gate electrode 32 and a tungsten silicide film are formed. The control gate electrode 32 is patterned into the shape of a control gate electrode by etching.

Figure 9:
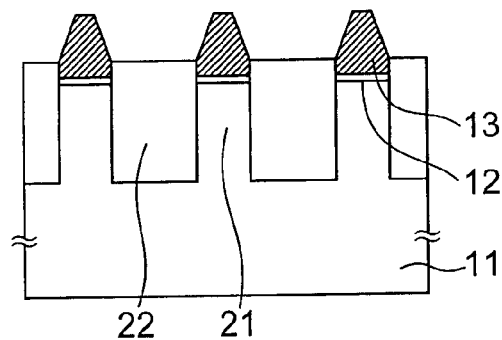
FIG. 9 is a sectional view showing a longitudinal sectional structure in a predetermined step of a method of fabricating the nonvolatile semiconductor memory according to the first embodiment.

Unnecessary portions of the control gate electrode 32 and inter-gate insulating film 31 are removed from the state shown in FIG. 8, thereby obtaining a state shown in FIG. 9.

Figure 10:
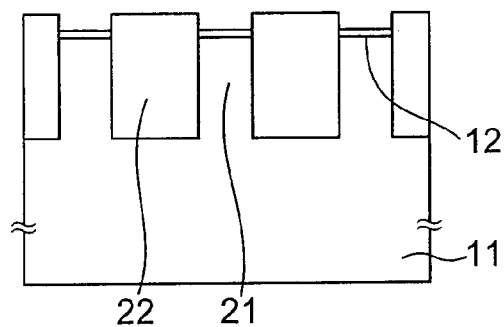
FIG. 10 is a sectional view showing a longitudinal sectional structure in a predetermined step of a method of fabricating the nonvolatile semiconductor memory according to the first embodiment.

Then, unnecessary portions of the floating gate electrodes 13 are removed as shown in FIG. 10. The gate electrode is patterned into a gate electrode shape by thus removing the unnecessary gate electrode portions.

After the gate electrode patterning step, a semiconductor device as shown in FIG. 1 is fabricated through general semiconductor device fabrication steps such as the formation of interlayer dielectric films, contacts, and interconnection layers.

REFERENCE EXAMPLE

Figure 11:
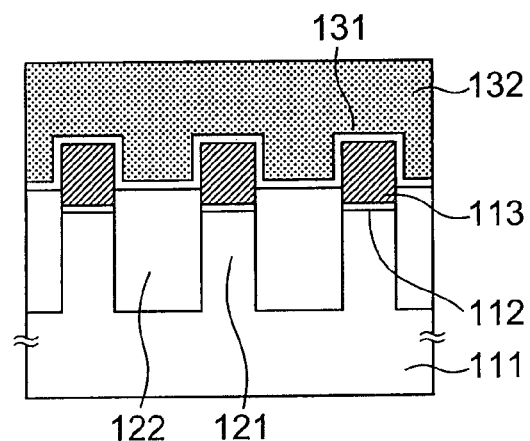
FIG. 11 is a sectional view showing the longitudinal sectional structure of a nonvolatile semiconductor memory according to the reference example of the present invention.
Figure 12:
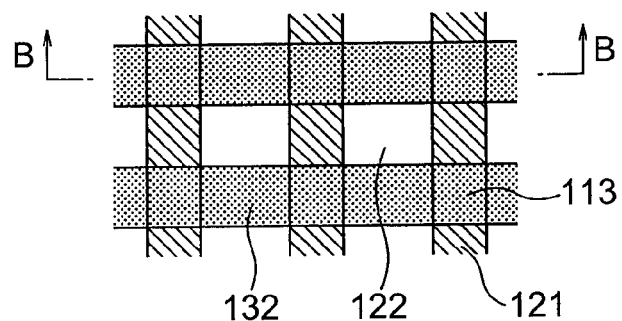
FIG. 12 is a plan view showing the planar structure of the nonvolatile semiconductor memory according to the reference example.

FIGS. 11 and 12 respectively show the sectional structure and planar structure of a nonvolatile semiconductor memory according to a reference example. FIG. 11 shows a longitudinal section taken along a line B-B in FIG. 12.

This semiconductor device comprises, in the surface portion of a semiconductor substrate 111, element isolation regions 122, element regions 121 isolated from each other by the element isolation regions 122, a floating gate electrode 113 formed on the surface of each element region 121 via a gate insulating film 112, and a control gate electrode 132 formed on the surfaces of the element isolation regions 122 and on the surfaces of the floating gate electrodes 113 on the element regions 121 via an inter-gate insulating film 131.

This device has a stacked gate structure formed by stacking the floating gate electrode 113, inter-gate insulating film 131, and control gate electrode 132. The element region 121 is formed in self-alignment with the floating gate electrode 113. The inter-gate insulating film 131 is formed on the upper surface of the floating gate electrode 113 and from the upper surface to the middle of each side surface of the floating gate electrode 113.

Unlike the floating gate electrode 13 of the first embodiment described above, the side surfaces of the floating gate electrode 113 of this reference example are perpendicular to the surface of the semiconductor substrate 111.

A method of fabricating the semiconductor device according to the reference example will be explained below.

Figure 13:
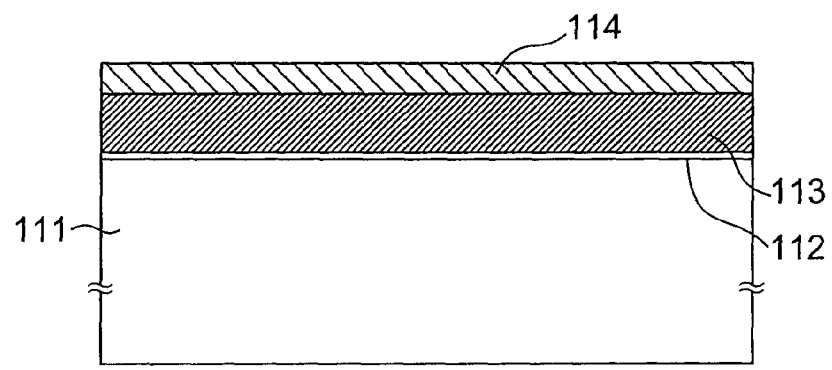
FIG. 13 is a sectional view showing a longitudinal sectional structure in a predetermined step of a method of fabricating the nonvolatile semiconductor memory according to the reference example.

As shown in FIG. 13, a gate insulating film 112, a polysilicon film 113 serving as a floating gate electrode, and a mask material 114 are sequentially formed on a semiconductor substrate 111.

Figure 14:
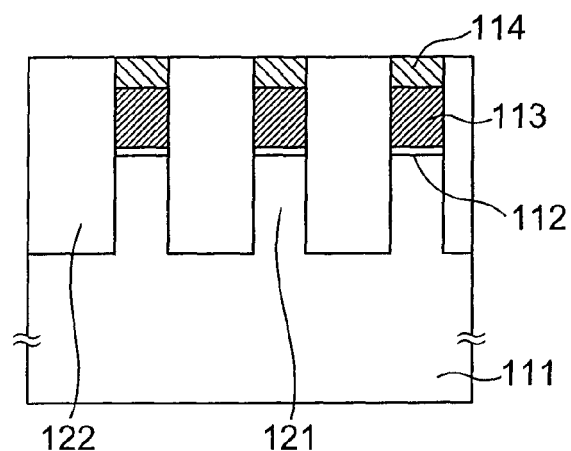
FIG. 14 is a sectional view showing a longitudinal sectional structure in a predetermined step of a method of fabricating the nonvolatile semiconductor memory according to the reference example.

As shown in FIG. 14, the mask material 114 is patterned, and the floating gate electrode 113, gate insulating film 112, and semiconductor substrate 111 are etched in self-alignment with the mask material 114, thereby forming grooves for element isolation regions 122. An insulating film is buried in the element isolation regions 122 and planarized by, e.g., CMP.

Figure 15:
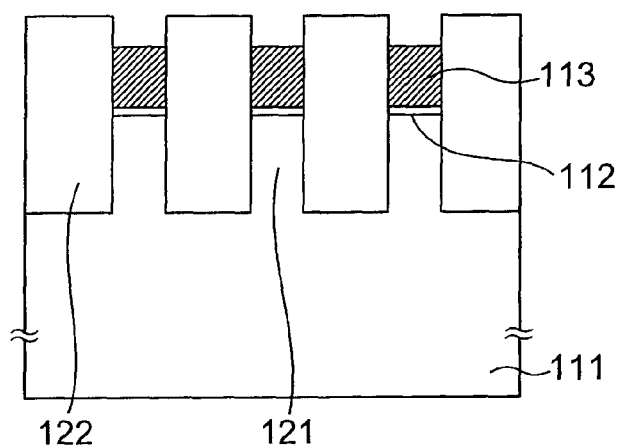
FIG. 15 is a sectional view showing a longitudinal sectional structure in a predetermined step of a method of fabricating the nonvolatile semiconductor memory according to the reference example.
Figure 16:
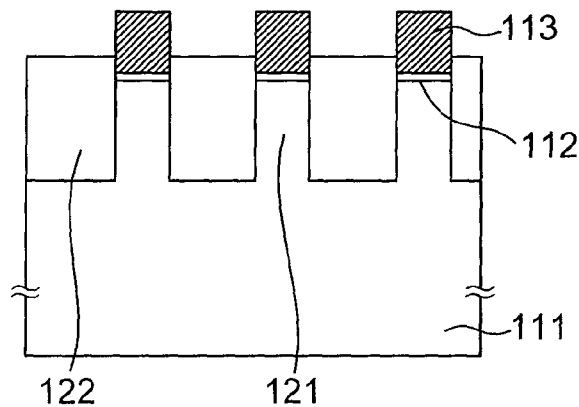
FIG. 16 is a sectional view showing a longitudinal sectional structure in a predetermined step of a method of fabricating the nonvolatile semiconductor memory according to the reference example.

The mask material 114 is removed as shown in FIG. 15, and the insulating films buried in the element isolation regions 122 are etched back as shown in FIG. 16. This makes the upper surfaces of the element isolation regions 122 lower than those of the floating gate electrodes 113.

In the first embodiment described above, as shown in FIG. 6, the floating gate electrodes 13 are etched to incline their side surfaces in this stage.

By contrast, the reference example does not perform this etching. As shown in FIG. 16, therefore, the side surfaces of the floating gate electrodes 113 remain perpendicular to the surface of the semiconductor substrate 111.

Figure 17:
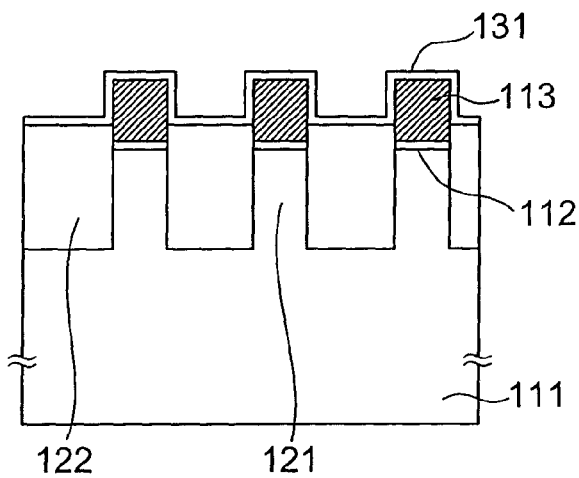
FIG. 17 is a sectional view showing a longitudinal sectional structure in a predetermined step of a method of fabricating the nonvolatile semiconductor memory according to the reference example.
Figure 18:
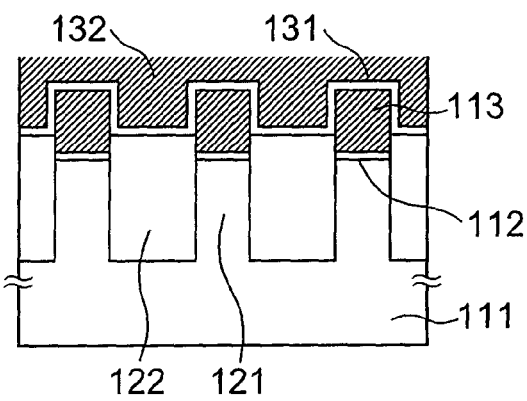
FIG. 18 is a sectional view showing a longitudinal sectional structure in a predetermined step of a method of fabricating the nonvolatile semiconductor memory according to the reference example.
Figure 19:
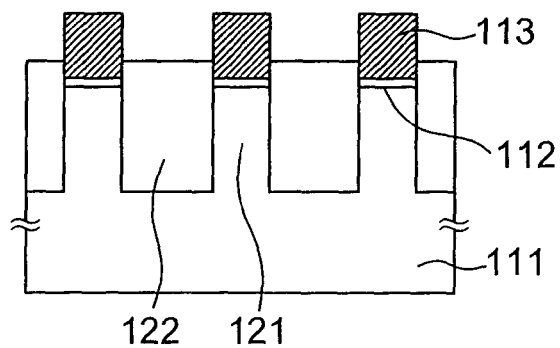
FIG. 19 is a sectional view showing a longitudinal sectional structure in a predetermined step of a method of fabricating the nonvolatile semiconductor memory according to the reference example.
Figure 20:
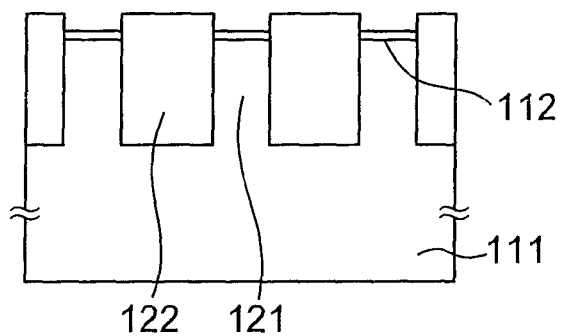
FIG. 20 is a sectional view showing a longitudinal sectional structure in a predetermined step of a method of fabricating the nonvolatile semiconductor memory according to the reference example.

Steps after that are the same as in the first embodiment. That is, an inter-gate insulating film 131 is formed on the surface as shown in FIG. 17, and a polysilicon film serving as a control gate electrode 132 and a tungsten silicide film are formed as shown in FIG. 18. The control gate electrode 132 is patterned into a gate electrode shape by etching. A state shown in FIG. 19 is obtained by removing the control gate electrode 132 and inter-gate insulating film 131, and the floating gate electrodes 113 are removed as shown in FIG. 20. The gate electrode is patterned by thus removing the unnecessary gate electrode portions.

After that, the semiconductor device is completed through fabrication steps such as the formation of interlayer dielectric films, contacts, and interconnection layers.

The nonvolatile memory according to this reference example has the following problems.

Figure 21:
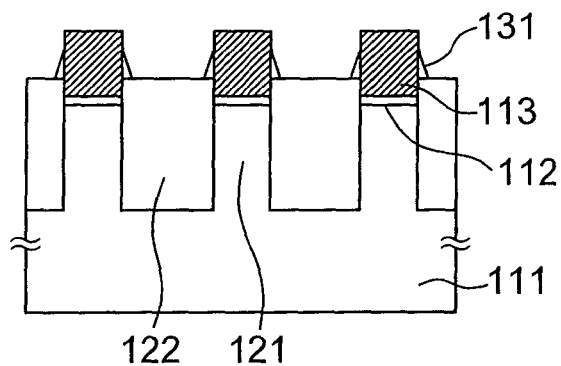
FIG. 21 is a sectional view showing a longitudinal sectional structure in a predetermined step of a method of fabricating the nonvolatile semiconductor memory according to the reference example.
Figure 22:
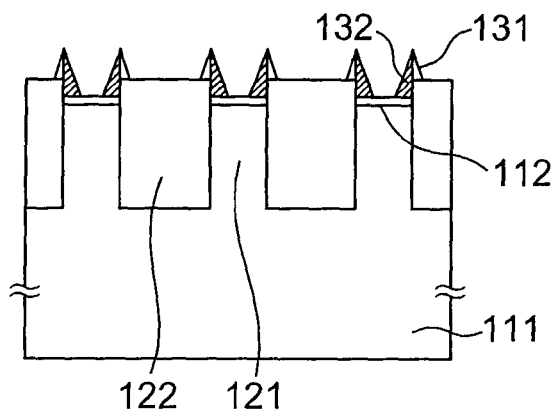
FIG. 22 is a sectional view showing a longitudinal sectional structure in a predetermined step of a method of fabricating the nonvolatile semiconductor memory according to the reference example.

(1) If generally used anisotropic etching is used to etch the inter-gate insulating film 131 subsequently to patterning of the gate electrode, residues 131 of the inter-gate insulating film 131 readily remain on the side surfaces of the floating gate electrodes 113 after the etching as shown in FIG. 21, because the effective film thickness (vertical component) of the inter-gate insulating film 131 on the side surfaces is large. If the residues 131 form, as shown in FIG. 22, residues 132 readily form when the floating gate electrodes 113 are etched after that. If the residues 132 made of the electrode material exist, an electrical shortcircuit occurs between adjacent gates, and this causes an operation error of the device.

Figure 23:
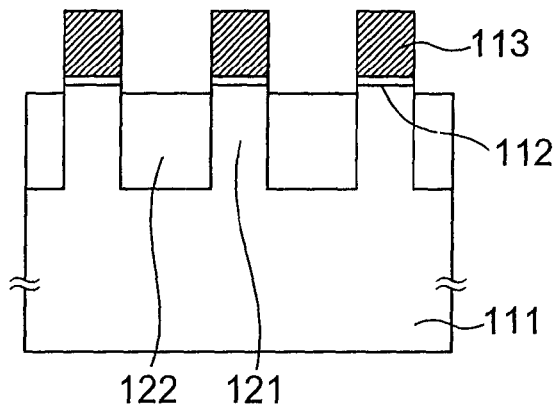
FIG. 23 is a sectional view showing a longitudinal sectional structure in a predetermined step of a method of fabricating the nonvolatile semiconductor memory according to the reference example.

(2) If the etching amount is increased to prevent the formation of the residues 131 of the inter-gate insulating film 131 when etching the inter-gate insulating film 131 subsequently to patterning of the gate electrode, the upper surfaces of the insulating films in the element isolation regions 122 are etched away as shown in FIG. 23. If the side surfaces of the element regions 121 are exposed, an operation error occurs In the reference example as described above, the side surfaces of the floating gate electrode 113 are perpendicular to the surface of the semiconductor substrate 111. In the first embodiment, however, the side surfaces of the floating gate electrode 13 incline to the surface of the semiconductor substrate 11. This makes the vertical component of the thickness of the inter-gate insulating film 31 smaller than that of the inter-gate insulating film 131 of the reference example.

Accordingly, the first embodiment can avoid the problem that the inter-gate insulating film 31 readily remains after etching. This makes it possible to prevent the problem as described as item (1) above in which an electrical shortcircuit occurs between adjacent gate electrodes owing to insufficient etching of the inter-gate insulating film 131, or the problem as described as item (2) above in which the side surfaces of the element region 121 are exposed because excess etching of the inter-gate insulating film 131 simultaneously etches the upper surface of the insulating film in the element isolation region 122.

Figure 24:
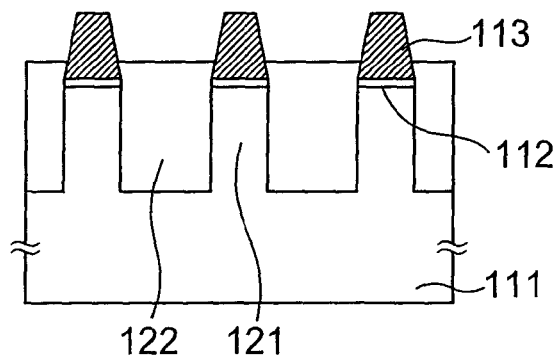
FIG. 24 is a sectional view showing a longitudinal sectional structure in a predetermined step of a method of fabricating the nonvolatile semiconductor memory according to the reference example.

A case in which the inter-gate insulating film 131 is etched subsequently to patterning of the gate electrode and then the floating gate electrodes 113 are etched to incline their side surfaces as shown in FIG. 24 in the reference example will be explained below.

Figure 25:
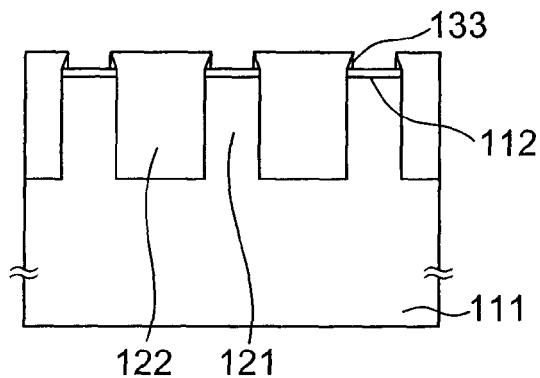
FIG. 25 is a sectional view showing a longitudinal sectional structure in a predetermined step of a method of fabricating the nonvolatile semiconductor memory according to the reference example.

(3) If generally used anisotropic etching is used to etch the floating gate electrodes 113, the insulating films buried in the element isolation regions 122 cover, in the form of eaves, the floating gate electrodes 113 at the ends of the element regions. As shown in FIG. 25, therefore, the floating gate electrodes 113 in these portions remain as residues 133. Consequently, an electrical shortcircuit occurs between adjacent gates, and this causes an operation error of the device.

In the first embodiment, however, the portion where the inter-gate insulating film 31 is not formed of the side surface of the floating gate electrode 13 is perpendicular to the surface of the semiconductor substrate 11. After the inter-gate insulating film 31 and floating gate electrodes 13 are etched after gate patterning, therefore, this prevents the insulating films buried in the element isolation regions 122 from remaining in the form of eaves as shown in FIGS. 24 and 25. This makes it possible to prevent the occurrence of an electrical shortcircuit between gates resulting from insufficient processing of the floating gate electrodes.

Second Embodiment

A nonvolatile semiconductor memory according to the second embodiment of the present invention will be explained below with reference to FIGS. 26 and 27.

Figure 26:
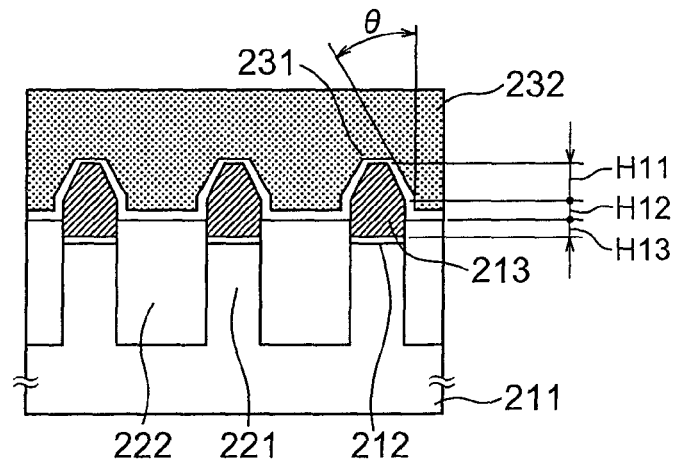
FIG. 26 is a sectional view showing the longitudinal sectional structure of a nonvolatile semiconductor memory according to the second embodiment of the present invention.
Figure 27:
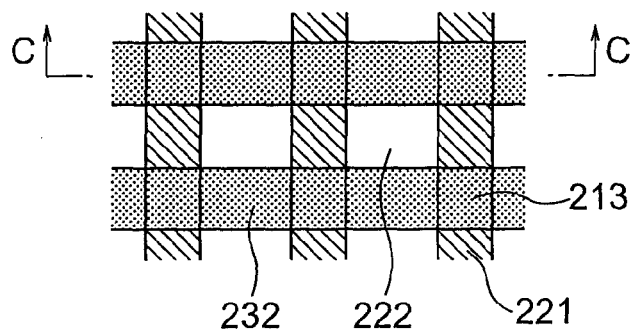
FIG. 27 is a plan view showing the planar structure of the nonvolatile semiconductor memory according to the second embodiment.

FIG. 26 is a sectional view, and FIG. 27 is a plan view. FIG. 26 shows a longitudinal section taken along a line C-C in FIG. 27.

This semiconductor device comprises, in the surface portion of a semiconductor substrate 211, element isolation regions 222, element regions 221 isolated from each other by the element isolation regions 222, a floating gate electrode 213 formed on the surface of each element region 221 via a gate insulating film 212, and a control gate electrode 232 formed on the surfaces of the element isolation regions 222 and on the surfaces of the floating gate electrodes 213 on the element regions 221 via an inter-gate insulating film 231.

This device has a stacked gate structure formed by stacking the floating gate electrode 213, inter-gate insulating film 231, and control gate electrode 232. The element region 221 is formed in self-alignment with the floating gate electrode 213. The inter-gate insulating film 231 is formed on the upper surface of the floating gate electrode 213 and from the upper surface to the middle of each side surface of the floating gate electrode 213.

In the first embodiment, as shown in FIG. 1, the floating gate electrode 13 has a tapered shape such that the portion having the height H1, where the inter-gate insulating film 31 is formed, from the upper surface to the middle of the side surface of the floating gate electrode 13 makes the inclination angle θ with the direction perpendicular to the surface of the semiconductor substrate 11. The portion having the height H2, where the inter-gate insulating film 31 is not formed, of the side surface of the floating gate electrode 13 is perpendicular to the surface of the semiconductor substrate 11. That is, the boundary between the tapered portion having the height H1 and the untapered portion having the height H2 matches the boundary where the inter-gate insulating film 31 is formed.

On the other hand, in the second embodiment, the floating gate electrode 213 is tapered such that, of a portion having height H11+height H12, where the inter-gate insulating film 231 is formed, from the upper surface to the side surface of the floating gate electrode 213, a portion having the height H11 formed to the middle of the side surface makes the inclination angle θ with the direction perpendicular to the surface of the semiconductor substrate 211. A portion having height H12+height H13 of the side surface is perpendicular to the surface of the semiconductor substrate 211.

Fabrication steps of the second embodiment are the same as the first embodiment until the steps shown in FIGS. 1 to 5. After that, in the first embodiment as shown in FIG. 6, the etching amount is large when inclining the side surface by isotropically etching the floating gate electrode 13 made of polysilicon. Therefore, the boundary between the inclined portion having the height H1 and the uninclined vertical portion having the height H2 substantially matches the surface of the element isolation region 22.

Figure 28:
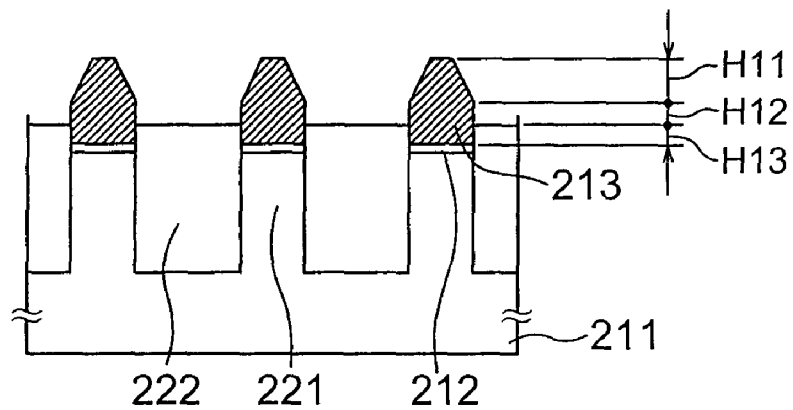
FIG. 28 is a sectional view showing a longitudinal sectional structure in a predetermined step of a method of fabricating the nonvolatile semiconductor memory according to the second embodiment.

In the second embodiment as shown in FIG. 28, the side surface is inclined by isotropically etching the floating gate electrode 213 in the same manner as in the first embodiment. However, the height H11 of the inclined portion is made smaller than the height H1 in the first embodiment by making the etching amount smaller than that in the first embodiment.

In the second embodiment, therefore, the boundary between the inclined portion having the height H11 and the uninclined vertical portion having height H12+height H13 is higher than the surface (the boundary between H12 and H13) of the element isolation region 222.

Etching for inclining the side surfaces of the floating gate electrodes 213 can be performed either after or simultaneously with etch back of the insulating films buried in the element isolation regions 222.

As in the first embodiment, etch back of the insulating films in the element isolation regions 222 is performed under the conditions that the selectivity of the insulating films to the polysilicon of the floating gate electrodes 213 is high, i.e., the insulating films are selectively etched with the polysilicon is left behind. As a consequence, the floating gate electrodes 213 remain even after etch back. However, etching may also be performed under the conditions that the polysilicon is also more or less etched together with the insulating films.

In the second embodiment, the side surfaces of the floating gate electrodes 213 can be partially inclined by using conditions having a low selectivity to the middle of etch back (from the upper surface to the height H11), and using conditions having a high selectivity in etch back to the height H11 after that.

Third Embodiment

A nonvolatile semiconductor memory according to the third embodiment of the present invention will be explained below with reference to FIGS. 29 and 30.

Figure 29:
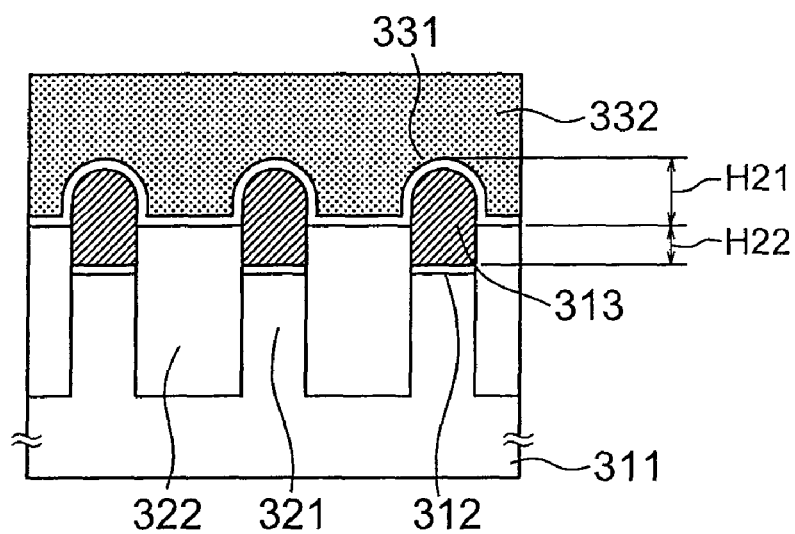
FIG. 29 is a sectional view showing the longitudinal sectional structure of a nonvolatile semiconductor memory according to the third embodiment of the present invention.
Figure 30:
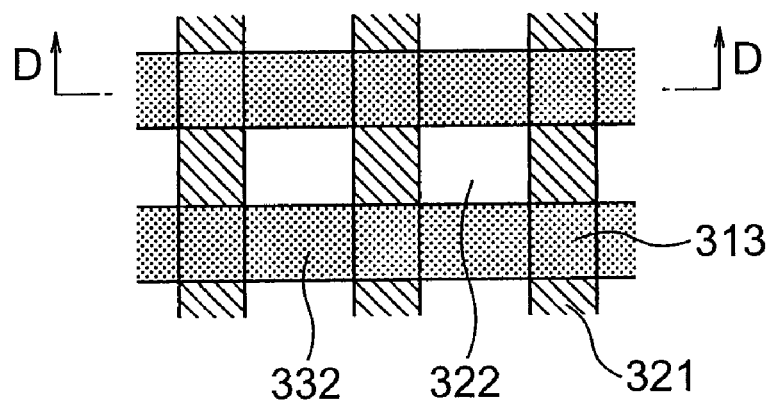
FIG. 30 is a plan view showing the planar structure of the nonvolatile semiconductor memory according to the third embodiment.

FIG. 29 is a longitudinal sectional view, and FIG. 30 is a plan view. FIG. 29 shows a longitudinal section taken along a line D-D in FIG. 29.

This semiconductor device comprises, in the surface portion of a semiconductor substrate 311, element isolation regions 322, element regions 321 isolated from each other by the element isolation regions 322, a floating gate electrode 313 formed on the surface of each element region 321 via a gate insulating film 312, and a control gate electrode 332 formed on the surfaces of the element isolation regions 322 and on the surfaces of the floating gate electrodes 313 on the element regions 321 via an inter-gate insulating film 331.

This device has a stacked gate structure formed by stacking the floating gate electrode 313, inter-gate insulating film 331, and control gate electrode 332. The element region 321 is formed in self-alignment with the floating gate electrode 313. The inter-gate insulating film 331 is formed on the upper surface of the floating gate electrode 313 and from the upper surface to the middle of each side surface of the floating gate electrode 313.

In the third embodiment, a portion having a height H21, where the inter-gate insulating film 331 is formed, from the upper surface to the middle of the side surface of the floating gate electrode 313 has an arcuate sectional shape. A portion having a height H22, where the inter-gate insulating film 331 is not formed, of the side surface of the floating gate electrode 313 is perpendicular to the surface of the semiconductor substrate 311.

This sectional shape is not limited to an arcuate shape. That is, that portion of the side surface of the floating gate electrode 313 which is covered with the inter-gate insulating film 331 need only have a shape which increases, toward the upper surface, the inclination angle to the direction perpendicular to the surface of the semiconductor substrate 311.

Fabrication steps of the third embodiment are the same as the first embodiment until the steps shown in FIGS. 1 to 5.

Figure 31:
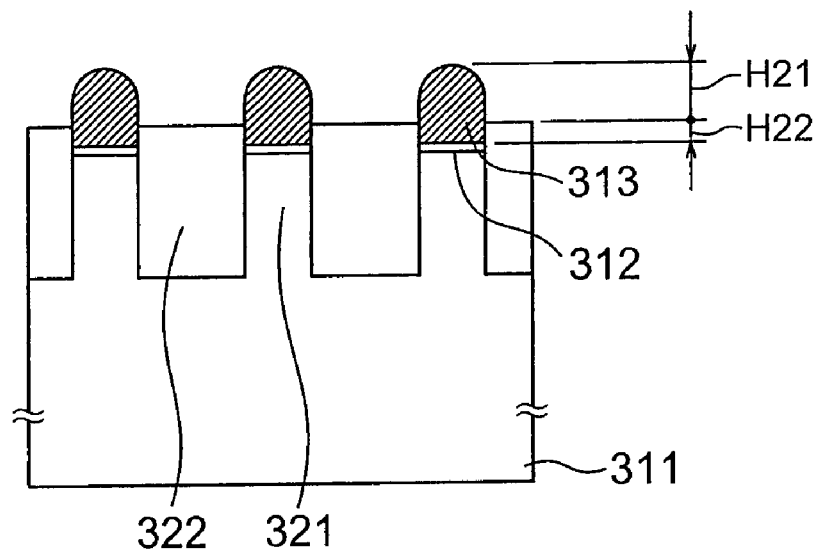
FIG. 31 is a sectional view showing a longitudinal sectional structure in a predetermined step of a method of fabricating the nonvolatile semiconductor memory according to the third embodiment.

After that, in the third embodiment as shown in FIG. 31, the upper corners of the portion having the height H21 of the floating gate electrode 313 are rounded by using, e.g., conditions which isotropically etch the polysilicon forming the floating gate electrode 313.

Etching for rounding the upper corners of the floating gate electrodes 313 can be performed either after or simultaneously with etch back of the insulating films buried in the element isolation regions 322.

The nonvolatile semiconductor memories and the methods of fabricating the same according to the above embodiments can prevent operation errors of the devices.

The above embodiments are merely examples and do not limit the present invention, so these embodiments can be variously modified within the technical scope of the invention. For example, the materials of the films used in the first to third embodiments are not limited and can also be other materials.

Figure 32:
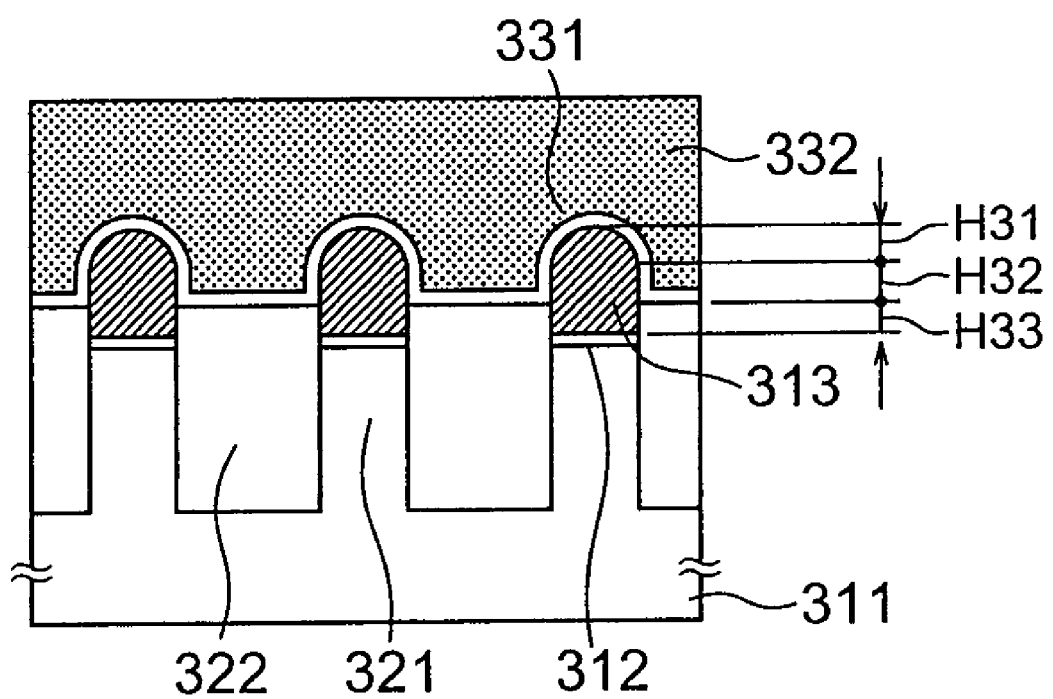
FIG. 32 is a sectional view showing a longitudinal sectional structure of the nonvolatile semiconductor memory according to a modification of the third embodiment.

As a modification of the third embodiment, as shown in FIG. 32, of a portion having height H31+height H32, where the inter-gate insulating film 331 is formed, from the upper surface to the middle of the side surface of the floating gate electrode 313, a portion having the height H31 formed to the middle of the side surface can also have an arcuate sectional shape. Of the side surface of the floating gate electrode 313, a portion having the height H32 where the inter-gate insulating film 331 is formed and a portion having the height H33 where the inter-gate insulating film 331 is not formed are perpendicular to the surface of the semiconductor substrate 311.

Furthermore, the sectional shape of this portion having the height H31 is not limited to an arcuate shape and need only be a shape which increases, toward the upper surface, the inclination angle to the direction perpendicular to the surface of the semiconductor substrate 311.

What is claimed is:
1. A nonvolatile semiconductor memory, comprising:
a floating gate electrode formed on a gate insulating film on an element region isolated by element isolation regions in a first direction on a semiconductor substrate;

an inter-gate insulating film which is in contact with a portion from an upper surface to a part of a side surface of said floating gate electrode; and a control gate electrode formed on said floating gate electrode via said inter-gate insulating film, wherein the upper surface of said floating gate electrode has a round-arched shape in the first direction.

2. The memory according to claim 1, wherein said element region is formed in self-alignment with said floating gate electrode.

3. The memory according to claim 1, wherein a lower side surface of said floating gate electrode and an upper side surface of said element region are connected in alignment with each other.

4. The memory according to clam 1, wherein an upper portion of the side surface of said floating gate electrode that is in contact with the said inter-gate insulating film has a shape, in which toward the upper surface of said floating gate electrode, an inclination angle of the side surface of said floating gate electrode to a direction perpendicular to a surface of said semiconductor substrate increases.

5. The memory according to claim 4, wherein a portion of the side surface of said floating gate electrode that is not in contact with said inter-gate insulating film has a substantially linear shape.

6. The memory according to claim 1, wherein, in a direction perpendicular to a surface of said semiconductor substrate, a height of a portion of the side surface of said floating gate electrode that is in contact with said inter-gate insulating film is greater than half a height of the side surface of said floating gate electrode.

7. The memory according to claim 1, wherein an upper portion of the side surface of said floating gate electrode that is in contact with the said inter-gate insulating film has a shape, in which toward the upper surface of said floating gate electrode, an inclination angle of the side surface of said floating gate electrode to a direction perpendicular to a surface of said semiconductor substrate increases at a point at which said floating gate electrode, said inter-gate insulating film, and a side face of said element isolation region are all in common contact.

8. A nonvolatile semiconductor memory, comprising:
element isolation regions disposed in a semiconductor substrate;
a floating gate electrode formed on a gate insulating film on an element region isolated by said element isolation regions in a first direction;
an inter-gate insulating film contacting with said floating gate electrode above an upper surface of said element isolation region; and
a control gate electrode formed on said floating gate electrode via said inter-gate insulating film, wherein an upper surface of said floating gate electrode has a round-arched shape in the first direction.

9. The memory according to claim 8, wherein one side of surfaces of said inter-gate insulating film is in contact with said element isolation region, and is in contact with said floating gate electrode above the upper surface of said element isolation region.

10. The memory according to claim 8, wherein said element region is formed in self-alignment with said floating gate electrode.

11. The memory according to claim 8, wherein a lower side surface of said floating gate electrode and an upper side surface of said element region are connected in alignment with each other.

12. The memory according to claim 8, wherein an upper portion of a side surface of said floating gate electrode which is in contact with the said inter-gate insulating film has a shape, in which toward the upper surface of said floating gate electrode, an inclination angle of the side surface of said floating gate electrode to a direction perpendicular to a surface of said semiconductor substrate increases.

13. A memory according to claim 12, wherein a portion of the side surface of said floating gate electrode that is in contact with said element isolation region has a substantially linear shape.

14. A memory according to claim 8, wherein in a direction perpendicular to a surface of said semiconductor substrate, a height of a portion of a side surface of said floating gate electrode that is in contact with said inter-gate insulating film is greater than half a height of the side surface of said floating gate electrode.

15. The memory according to claim 8, wherein an upper portion of a side surface of said floating gate electrode that is in contact with the said inter-gate insulating film has a shape, in which toward the upper surface of said floating gate electrode, an inclination angle of the side surface of said floating gate electrode to a direction perpendicular to a surface of said semiconductor substrate increases at a point at which said floating gate electrode, said inter-gate insulating film, and a side face of said element isolation region are all in common contact.

* * * * *